United States Patent [19]

Saito et al.

[11] Patent Number: 5,021,114
[45] Date of Patent: Jun. 4, 1991

[54] APPARATUS FOR TREATING MATERIAL BY USING PLASMA

[75] Inventors: Hiroshi Saito, Fujisawa; Yasumichi Suzuki, Yokohama; Shunji Sasabe, Iruma; Kazuhiro Nakajima, Ome, all of Japan

[73] Assignee: Hitachi, Ltd., Tokyo, Japan

[21] Appl. No.: 221,272

[22] Filed: Jul. 19, 1988

[30] Foreign Application Priority Data

Jul. 20, 1987 [JP] Japan ................................. 62-178997
Aug. 10, 1987 [JP] Japan ................................. 62-198200
Nov. 6, 1987 [JP] Japan ................................. 62-279239

[51] Int. Cl.⁵ .......................................... H01L 21/00
[52] U.S. Cl. .................................. 156/345; 156/643;
156/646; 204/298.37; 204/298.38; 219/121.4; 118/723
[58] Field of Search ................. 204/298.38, 298.37, 204/298.16; 219/121.4; 156/643, 646, 345; 118/723

[56] References Cited

U.S. PATENT DOCUMENTS

| | | | |
|---|---|---|---|
| 4,609,428 | 9/1986 | Fujimura | 156/345 |
| 4,745,337 | 5/1988 | Pichot et al. | 156/345 |
| 4,776,918 | 10/1988 | Otsubo et al. | 156/345 |
| 4,816,113 | 3/1989 | Yamazaki | 156/345 |
| 4,819,118 | 1/1990 | Ooiwa et al. | 156/345 |
| 4,926,791 | 5/1990 | Hirose et al. | 156/345 |

FOREIGN PATENT DOCUMENTS

| | | | |
|---|---|---|---|
| 2837594 | 3/1979 | Fed. Rep. of Germany | 219/121.4 |
| 57-26441 | 2/1982 | Japan | 118/723 |

Primary Examiner—David A. Simmons
Assistant Examiner—Thi Dang
Attorney, Agent, or Firm—Kenyon & Kenyon

[57] ABSTRACT

A sputter etching apparatus including a vacuum chamber provided with a gas supply system and an evacuator, a sputter etching electrode disposed within the vacuum chamber on which a substrate is disposed, a plasma generator for generating plasma by applying microwave energy and disposed in opposition to the sputter etching electrode, a voltage applying stud provided in association with the sputter etching electrode for causing ions in the plasma to impact against the substrate, a first power supply source provided in association with the plasma generator for generating the plasma, and a second power supply source provided independent of the first power supply source for supplying the voltage for causing the ions to impact against the substrate. A magnetic field generating magnet or coil assembly can be incorporated in the apparatus for generating a magnetic field in such a manner in which the plasma produced within a space defined between the substrate and the microwave inlet window is peripherally surrounded by the magnetic lines of forces. Further disclosed in a plasma treatment apparatus which includes an activating chamber equipped with plasma generator and a first raw gas supplying system, a reaction chamber spatially coupled to the activating chamber and containing an electrode for supporting thereon a substrate to be treated, an evacuator for evacuating the activating chamber and the reaction chamber down to a predetermined pressure. The activating chamber is directly connected to the reaction chamber for shortening the distance between the activating chamber and the substrate to be treated. A second raw gas supplying system for supplying a raw gas to the reaction chamber is provided in the connecting portion between the activating chamber and the reacting chamber.

20 Claims, 14 Drawing Sheets

APPARATUS FOR TREATING MATERIAL BY USING PLASMA

BACKGROUND OF THE INVENTION

The present invention relates in general to a method and apparatus for treating a material such as substrate, wafer or the like by utilizing a plasma. More particularly, the present invention is concerned with a method and apparatus for etching a substrate by sputtering at a high speed by utilizing a plasma without damaging or injuring the substrate. The invention is further concerned with a method and apparatus for depositing a film by a plasma CVD process at a high speed.

There is known in the prior art such a sputter etching apparatus in which an etching electrode having a substrate disposed thereon is mounted within a vacuum chamber. By applying a high-frequency power to the electrode, a plasma is produced over the substrate, wherein ions in the plasma are caused to impact against the substrate under acceleration by the electric field generated under the potential appearing on the substrate, whereby the latter is etched by the sputtering. With this structure of the sputter etching apparatus, however, the plasma produced over or above the substrate is of a low density, as a result of which the sputter etching can proceed only at a low speed. When the high-frequency power applied to the etching electrode is increased in an effort to speed up the sputter etching, the ions will then impact against the substrate with increased energy because of a high voltage appearing on the electrode and substrate, giving rise to the possibility of the substrate being undesirably damaged or injured. As a means of increasing the sputter etching rate or speed with energy of the ions bombarding the substrate being maintained at a low level, there can be mentioned a method which is disclosed in Japanese Patent Application Laid-Open No. 74436/1985 (JP-A-60-74436). According to this known proposal, a plasma produced by applying a high-frequency power to the etching electrode is confined within a delimited space over the substrate by using a floating electrode in combination with a magnet for the purpose of preventing the plasma from diffusing radially outwardly while increasing the number of ions in the plasma and hence the density thereof. With this arrangement, the voltage making appearance on the etching electrode can certainly be prevented from being increased relative to the power applied to the electrode. It is however noted that the increase in the density of plasma is not proportional to the increase in the power applied to the etching electrode at a definite one-to-one ratio. Consequently, when the applied high-frequency power is increased in order to further speed up the etching, the voltage appearing on the electrode is increased to such an extent that damage or injury can occur, to the substrate.

Another plasma treatment apparatus of the prior art is disclosed in JP-A-57-26441. In the case of this known apparatus, there is provided, in combination with the reaction chamber, a preliminary excitation chamber into which only a gas difficult to activate is supplied for preliminary excitation, the gas thus activated is then introduced into the reaction chamber together with a gas easy to activate. In this way, concentration of the activated gases which partake straightforwardly in the formation of a film can be increased without need for applying a high power to the electrode within the reaction chamber, whereby the material to be treated such as a substrate can be protected against damage or injury. Besides, by regulating the electric power supplied to the preliminary excitation chamber and the reaction chamber, the ratio of composition of the film formed by deposition can be controlled for ensuring a high quality of the film. However, this known apparatus suffers from a shortcoming that the activation of the gas difficult to activate is inadequate because excitation of the gas of this species relies on a high-frequency discharge.

A further plasma treatment method in the prior art is disclosed in JP-A-57-167631. According to this known technique, the preliminary excitation of a reactant gas is realized by utilizing microwave energy. By using a microwave (usually having a frequency of 2.45 GHz) in place of a high-frequency signal (normally of 13.56 MHz) as proposed, the plasma density is increased by one to two orders of magnitude (approximately up to $10^{11}/cm^3$) because the ratio at which the reactant gas is excited due to impact of electrons in the plasma is increased, whereby concentration of the activated gas is enhanced.

However, in the case of the known apparatus just mentioned above, a long distance intervenes between the activating chamber and the reaction chamber. Besides, a passage for introducing the activated gas into the reaction chamber is provided at an offset position. Consequently, difficulty is encountered in introducing the gas activated through the preliminary excitation onto a substrate under treatment uniformly without lowering concentration of the activated gas. Such being the circumstances, it is difficult to carry out the treatment uniformly at a high speed, although it is admitted that a film of improved quality can be formed on the substrate.

As will be seen from the above discussion, according to the prior art techniques, in these endeavors consideration is not paid to the uniform formation of a high quality film on a substrate at a high speed without injuring the substrate. In other words, according to the known techniques such as mentioned above, the quality and/or uniformity of the film as formed will degrade when the treating rate or speed is increased. Thus an attempt for forming a uniform film of high quality is inevitably accompanied with lowering in the treating speed in the case of the hitherto known techniques.

SUMMARY OF THE INVENTION

It is therefore a first object of the present invention to provide a sputter etching method and apparatus capable of making available a plasma having a high and uniform density for allowing the etching of a substrate to be carried out at a high speed owing to a reliable and simple mechanism, without damaging the substrate, by providing power supply sources separately for generation of the plasma on one hand and for the voltage causing ions in the plasma to impact against the substrate on the other hand, which power supply sources are thus adapted to be controlled independent of each other.

A second object of the present invention is to provide a plasma treatment method and apparatus capable of forming a film of high quality uniformly on a substrate by plasma CVD process at high speed while avoiding damage of the substrate given by the plasma.

In view of the first object mentioned above, it is proposed according to a first aspect of the invention that a plasma generating means is provided in opposition to an etching electrode which is mounted within a vacuum chamber and on which a substrate is disposed. By utilizing microwave energy (e.g. a microwave having a frequency of 2.45 GHz), a plasma of a high density is produced over the substrate, wherein ions in the plasma are caused to impact against the substrate under action of a voltage appearing on the etching electrode by applying a high frequency power to the etching electrode. More specifically, the plasma generating means for producing the plasma through excitation by using microwave energy is constituted by a microwave generating source, a cavity and a microwave injection window, wherein a matching means is provided within the cavity for operating it as a cavity resonator for the microwave. The cavity may be implemented in a coaxial structure and so dimensioned that the microwave can assume an axis-symmetrical mode within the cavity. The microwave injection window serves two functions: first, it serves as a partition wall constituting a part of a vacuum chamber for partitioning the latter from the cavity, and second, it serves as a window for radiating or injecting the microwave into the vacuum chamber from the cavity. To this end, the microwave injection window is formed of an electrically insulating material capable of scarcely absorbing microwave energy and impermeable to gases. By way of example, the microwave injection window may be made of quartz, alumina or other ceramics. The cavity resonator may be either of coaxial or rectangular configuration, not to speak of a circular configuration, as is well known in the art. It is however preferred to implement the cavity resonator in a circular configuration of coaxial type in view of ease in obtaining a plasma of uniform density distribution over the etching electrode. When the substrate to be etched is an electrically insulating material, it is indispensable to apply a high-frequency (radio-frequency) power to the etching electrode. However, in the case where the substrate to be treated is made of an electrically conductive material such as a metal, a DC power supply source may be used in place of the high-frequency power supply source.

With the structure of the plasma generating means composed of the microwave generating source, the cavity, the matching means for allowing the microwave to enter the cavity effectively and the microwave injection window through which microwave energy is introduced into the vacuum chamber as described above, the microwave generated by the microwave generating source and guided to the cavity through a suitable wave guide can be effectively introduced into the cavity by operating the cavity as the cavity resonator for the microwave of concern with the aid of the matching means. Subsequently, the microwave is introduced into the vacuum chamber through the microwave-transmissive injection window to ionize an atmospheric gas (e.g. Ar gas) within the vacuum chamber for thereby producing a plasma. In this conjunction, it should be noted that the microwave transfers energy thereof to the plasma in the course of propagation therethrough, as the result of which the plasma of increased density is made available. By way of example, with the microwave having a frequency of 2.45 GHz, a plasma density on the order of $7.4 \times 10^{10}/cm^3$ can be achieved. Further, by dimensioning the cavity in such a configuration that the axis-symmetrical mode of the microwave prevails within the cavity or adopting the coaxial conduit configuration, there can be produced a plasma exhibiting a high uniformity of density.

A substrate to be treated is disposed on the etching electrode over which the high-density plasma produced by the plasma generating means in the manner described above prevails, wherein a high-frequency power (usually at a frequency of 100 kHz to 100 MHz) is applied to the etching electrode from the high-frequency power supply source connected thereto. A high voltage thus making appearance on the surface of the substrate disposed on the etching electrode causes ions in the plasma to impact against the substrate, whereby etching is carried out by the sputtering.

By providing the power supply sources separately for producing the plasma on one hand and for generating the voltage for causing the ions to impact against the substrate, respectively, as described above, the density of the plasma as produced and energy with which the ions in the plasma bombard the substrate can be separately and independently controlled. Since the plasma can be produced with a high density by microwave energy in this manner, the sputter etching can be carried out at an increased rate without injuring the substrate. As mentioned hereinbefore, although the high-frequency power supply source is indispensably required in the application where the material to be etched by sputtering is of an electrically insulating material, it should be understood that a DC power supply source may be employed when the substrate is made of an electrically conductive material such as a metal.

In view of the first object mentioned above, it is proposed according to another aspect of the present invention that in a sputter etching apparatus which comprises the vacuum chamber equipped with a gas supply system and an evacuator, the sputter etching electrode disposed within the vacuum chamber for supporting thereon a substrate to be treated, the plasma generator producing a plasma through excitation by microwave energy, the cavity of the plasma generating cavity being disposed on the vacuum chamber in opposition to the substrate with the microwave injection window being interposed between the plasma generating cavity and the vacuum chamber, the voltage applying means provided in association with the sputter etching electrode for causing ions in the plasma to impact against the substrate, the power supply source provided in association with the plasma generator means, and the second power supply source provided independent of the first power supply source for supplying the voltage for causing the ions in the plasma to impact against the substrate, there is provided a magnetic field generator generating a magnetic field in such a manner in which the plasma produced within a space defined between the substrate and the microwave injection window is peripherally surrounded by magnetic lines of force. The magnetic field generator may be implemented in various structures mentioned below according to further features of the present invention.

Examples of such structures are:

(1) a ring-like array of juxtaposed magnets which are magnetized in the radial direction with polarities thereof being alternately inverted from one to another along the circumferential direction;

(2) an array of paired ring-like magnets one of which is disposed on the side of the microwave injection window with the other being disposed on the side of the etching electrode;

(3) an array of the paired ring-like magnets mentioned above in which the magnets are, however, constituted by coils, respectively;

(4) an array of the paired ring-like coils mentioned above which are arranged to conduct respective electric currents in the directions opposite to each other;

(5) an array of the paired ring-like coils mentioned above which are arranged to conduct respective electric currents in a same direction;

(6) an array of the paired ring-like magnets mentioned above in which the magnets are constituted by permanent magnets, respectively;

(7) an array of the paired ring-like permanent magnets mentioned above in which the permanent magnets are magnetized circumferentially in directions opposite to each other;

(8) an array of the paired ring-like permanent magnets mentioned above in which the permanent magnets are magnetized thicknesswise in directions opposite to each other;

(9) an array of the paired ring-like permanent magnets mentioned above in which the permanent magnets are radially magnetized in the directions opposite to each other.

When the magnetic field generator means is constituted by coil(s), the latter may be realized by using a superconductor so that a current can flow therethrough permanently for generating a highly stable magnetic field. The magnetic field for stably confining the plasma should preferably be of a cups-like profile.

The power applied to the etching electrode is usually of a high-frequency power having a frequency in the range of 100 kHz to 100 MHz. However, when the substrate for treatment is made of an electrically conductive material, the power applied to the etching electrode may be a DC power. It goes without saying that the application of high-frequency power is indispensable when the substrate is of an electrically insulating material.

By virtue of disposition of the magnetic field generator in such a manner as to enclose the plasma around the periphery thereof, the plasma is confined within a space above the substrate by the magnetic field produced by the magnetic field generator means, whereby the plasma is positively prevented from diffusing radially outwardly. Thus, the plasma is maintained stably at a high density substantially independent of the pressure within the vacuum chamber.

In this way, the etching electrode having the substrate disposed thereon is positioned below the high-density plasma produced by the above mentioned plasma generator, wherein the high-frequency power (generally of a frequency in the range of 100 kHz to 100 MHz) is applied to the etching electrode by connecting thereto the high-frequency power supply source. Under the voltage thus making appearance on the surface of the substrate disposed on the etching electrode, ions in the plasma are caused to impact against the substrate, as the result of which the substrate is etched by sputtering. Because of provision of separate power supply sources for the plasma generation and the ion acceleration for the sputter etching, respectively, the plasma density and energy at which ions bombard the substrate can be separately controlled independent of each other. Further due to high density of the plasma generated through excitation by the microwave, the sputter etching can be achieved at a high etching speed without damaging the substrate.

In view of the second object mentioned previously, there is provided according to a second aspect of the present invention a plasma treatment apparatus which comprises two chambers partitioned from each other, i.e. an activating chamber provided with a plasma generator and a reaction chamber having an electrode for disposing thereon a substrate (a material to be treated), wherein a reactant gas difficult to excite is activated in the activating chamber by the plasma produced through excitation by the microwave and fed onto the substrate through a plurality of first small holes formed in a partition plate disposed at the boundary between the activating chamber and the reaction chamber, while a reactant gas easy to activate is supplied onto the substrate through a passage and a plurality of second small holes formed in the partition plate to be activated by a plasma produced over the substrate. In this way, the plasma treatment apparatus includes the activating chamber and the reaction chamber containing the substrate. In the activating chamber, plasma of high density on the order of $7.4 \times 10^{10}/cm^3$ can be produced by application of microwave energy. However, because of the absence of any magnetic field, the microwave can no longer propagate through the plasma when the density thereof has attained the abovementioned value. Instead the microwave encounters reflection at the surface of the plasma, thus making it impossible to further increase the plasma density. According to the present invention that a microwave introducing member is implemented in a convex-like projecting structure with a view to increasing the area over which the microwave is brought into contact with the plasma to thereby increase the volume of the plasma. Further, by dimensioning the activating chamber so as to satisfy the conditions for resonance, ignition of the plasma as well as generation thereof can be facilitated, whereby the reactant gas that is difficult to activate which is introduced into the activating chamber can be activated to a high concentration as desired.

The flat plate or wall provided between the activating chamber and the reaction chamber is so implemented as to be capable of supplying uniformly both the difficult-to-activate gas activated in the activating chamber and the easy-to-activate gas to the substrate. In this conjunction, the distance between the activating chamber and the substrate may preferably be shortened that the activated gas can be fed uniformly onto the substrate without lowering the concentration thereof. To this end, the partitioning plate or wall is positioned so that the gas blow-out holes face toward the substrate with the activating chamber being disposed in opposition to the substrate through interposition of the partitioning wall therebetween.

The gas activated in the activating chamber is a gas which is difficult to activate. On the other hand, the gas easy to activate is straightforwardly supplied to the reaction chamber without passing through the activating chamber and is activated within the reaction chamber by the plasma produced over the substrate through excitation by a low power of high frequency applied to the substrate. For realizing the uniform supply or introduction of the easy to activate gas over the substrate, the partitioning plate or wall is provided with small holes alternately with those communicated with the activating chamber.

With the arrangement described above, concentration of the activated gas which is difficult to activate can be increased independent of the gas easy to activate and fed uniformly onto the substrate without lowering the concentration. On the other hand, the gas easy to activate is activated only by the plasma of low energy produced over the substrate through excitation by the low power of high frequency applied to the substrate. In this way, it is possible to control appropriately the ratio of concentrations of plural reactant gases, whereby a film can be formed at a high speed without deteriorating the quality thereof. Further, the gases can be supplied uniformly over the substrate by means of the boundary plate or wall provided with pluralities of blow-out holes of small diameters separately for both the gases.

In the reaction chamber, the gas easy to activate discharged from the associated blow-out holes formed in the partitioning wall mentioned above is activated by the plasma of low density produced over the substrate to undergo reaction with the activated gas supplied from the activating chamber, whereby a film is deposited over the exposed surface of the film.

Now, it will be appreciated that the reactant gases can be activated by respective associated plasmas independent of each other, whereby the activated gases can be fed uniformly toward the substrate with high efficiency. In this way, a film of high quality can be formed over the substrate at a high speed.

DETAILED DESCRIPTION OF THE PRESENT INVENTION

Now, the present invention will be described in detail in conjunction with preferred and exemplary embodiments thereof by reference to the drawings.

Figure 1:
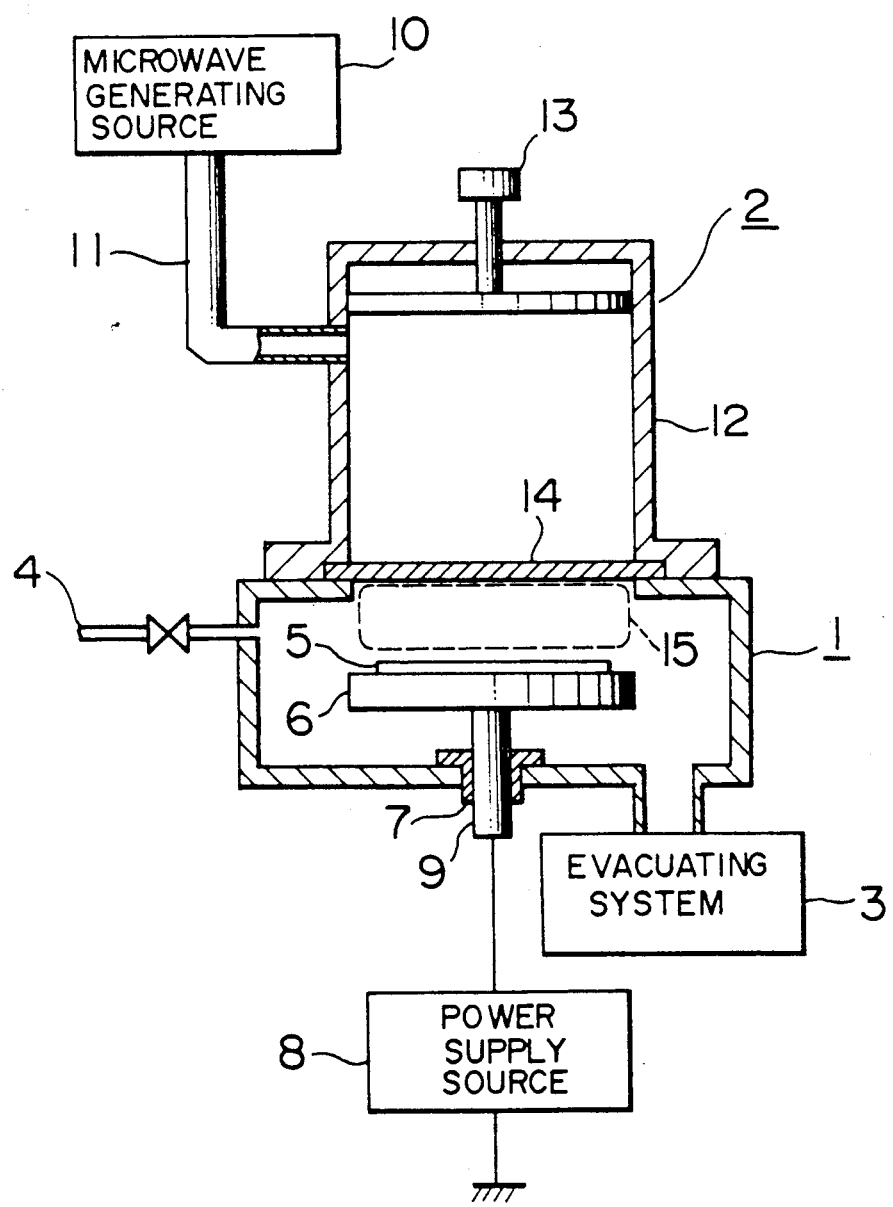
FIG. 1 shows in a partially sectioned side elevational view a sputter etching apparatus according to a first embodiment of the present invention.

FIG. 1 shows a sputter etching apparatus according to a first embodiment of the present invention. As will be seen in the figure, the sputter etching apparatus comprises as primary components thereof a vacuum cell or chamber 1, a plasma generating unit 2, an evacuating system 3 and a gas supply system 4. There is disposed fixedly within the vacuum chamber 1 an etching electrode 6 through an interposed flange 7 which serves for electrically insulating the electrode 6 from the vacuum chamber 1 in a vacuum-tight manner. A substrate 5 is disposed on the top of the electrode 6. The etching electrode 6 has a supporting stud 9 having a lower end extending outwardly from the vacuum chamber 1 and connected electrically to a power supply source 8. The plasma generating unit 2 in turn is composed of a microwave generating source 10, a waveguide 11, a cavity 12, a matching element 13 and an inlet window 14 which may be formed of a quartz plate.

With the structure of the sputter etching apparatus described above, a microwave is generated through oscillation of the microwave generating source 10 to be fed into the cavity 12 by way of the waveguide 11. Through adjustment by means of the matching element 13, there can be established the conditions required for the cavity 12 to function as the cavity resonator for the microwave applied thereto. Thus, the electric field of the microwave within the cavity 12 is intensified. The microwave is then introduced into the vacuum chamber 1 through the injection window 14, as the result of which the atmospheric gas within the vacuum chamber 1 supplied from the gas supply system 4 is ionized, whereby plasma 15 is produced. The plasma 15 has a density which can be controlled by the power of the microwave up to a limit value at which the microwave can no longer supply energy to the plasma 15 in the course of propagation therethrough (e.g. up to the density of $7.4 \times 10^{10}/cm^3$ at the microwave frequency of 2.45 GHz). Ions within the plasma 15 thus produced are accelerated under the influence of a high-frequency power applied to the substrate 5 from the power supply source 8 through the etching electrode 6 connected thereto, whereby the accelerated ions are caused to impinge against the substrate 5. In this way, the sputter etching is carried out. In this connection, it should be mentioned that a uniform distribution of density of the plasma 15 located over the substrate 5 can be realized by dimensioning the cavity 12 such that the axis-symmetrical mode of the microwave may prevail within it.

Figure 2:
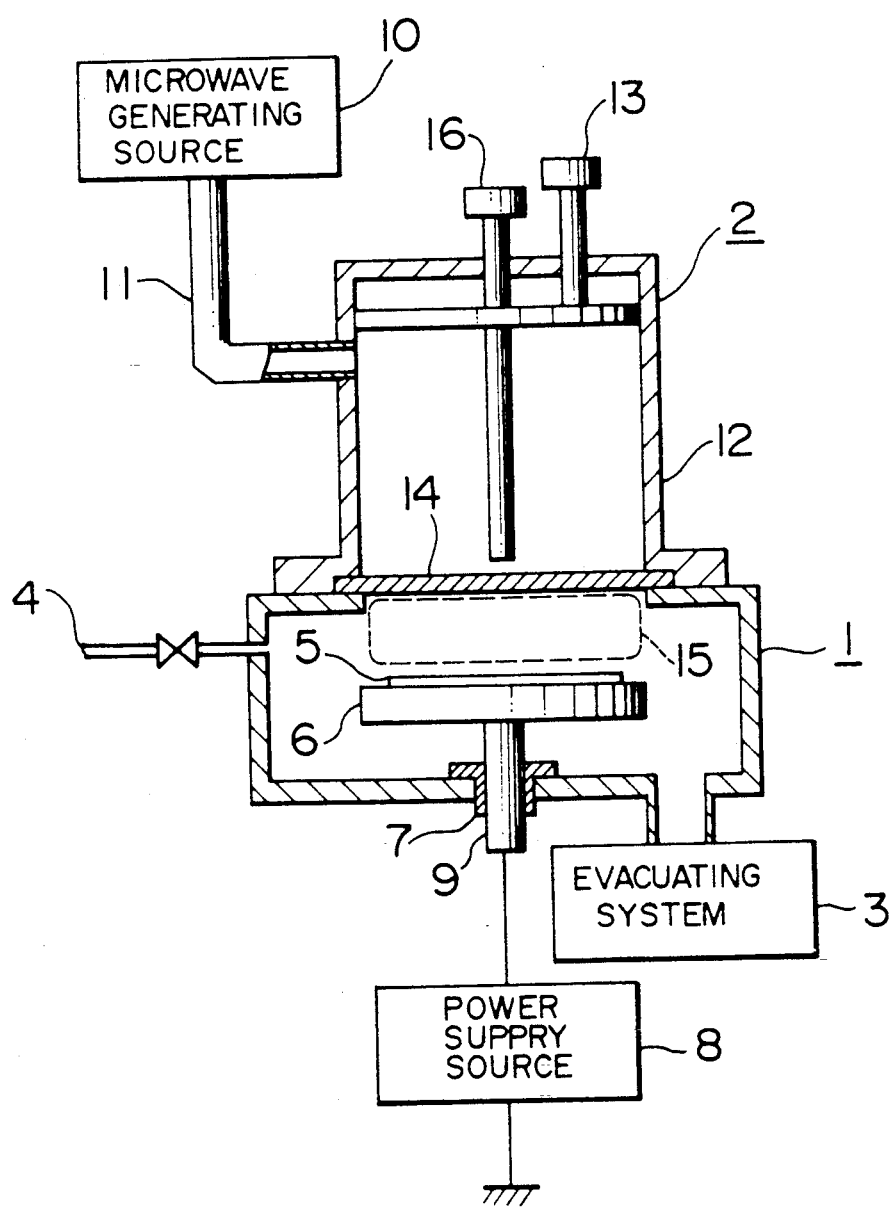
FIG. 2 shows in a partially sectioned side elevational view a sputter etching apparatus according to a second embodiment of the present invention.

FIG. 2 shows a sputter etching apparatus according to a second embodiment of the present invention. This sputter etching apparatus is also composed of a vacuum chamber 1, a plasma generating unit 2, an evacuating system 3 and a gas supply system 4 in an arrangement similar to that of the embodiment in FIG. 1 except that a bar 16 is coaxially disposed within the cavity 12 constituting a part of the plasma generating unit, whereby the cavity 12 is implemented in the form of a coaxial cavity. With the structure of the sputter etching apparatus according to the second embodiment described above, the microwave fed into the cavity 12 exhibits a coaxial mode within the cavity 12, whereby the axis-symmetrical mode of the microwave can be easily established more stably within the cavity 12, which in turn means that uniform distribution of density of the plasma 15 over the substrate 5 within the vacuum chamber 1 can be realized more stably.

According to the embodiments of the present invention described above with respect to FIGS. 1 and 2, the plasma of high density generated by the plasma generating unit utilizing the microwave as the excitation or ionization source can be transformed to an axis-symmetrical stable plasma of high density by virtue of the provision of the cavity matching element 13 for adjusting the cavity dimension as well as the coaxial bar 16, wherein the density of plasma can be controlled by correspondingly controlling the power or energy of the microwave. On the other hand, the sputter etching of a substrate by using the plasma can be carried out by controlling the power supply connected to the etching electrode 6. More specifically, rate of etching and energy with which ions bombard the substrate can be separately controlled. Further, because of availability of a high-density plasma through ionization by the microwave, speeding-up of the etching treatment can be attained while the possibility of damaging the substrate is significantly reduced.

Figure 3:
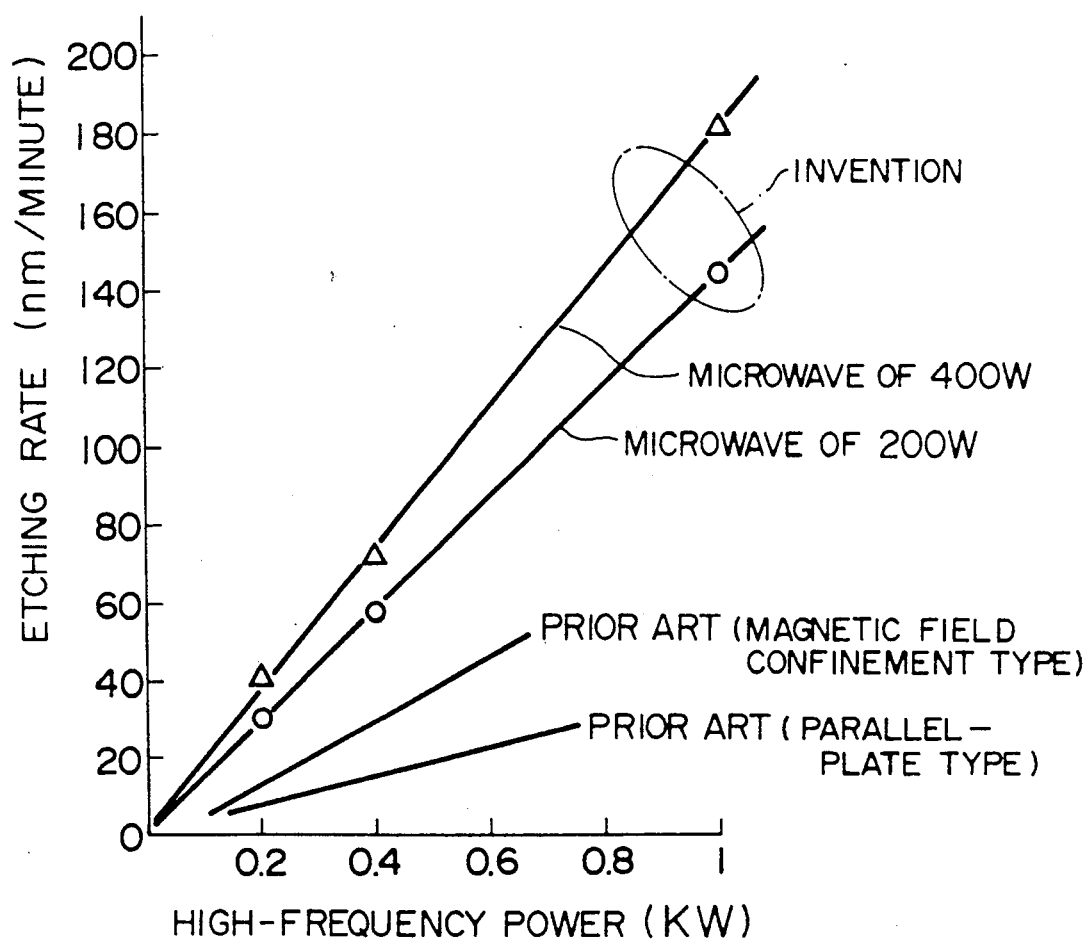
FIG. 3 is a view for graphically illustrating a relationship between the etching rate and the high-frequency power in the sputter etching apparatus according to the present invention comparatively with that of a prior art apparatus.

The results of the sputter etching performed on a thermally grown oxide film ($SiO_2$) formed on a substrate made of Si by employing the sputter etching apparatus of the structures described above are graphically illustrated in FIG. 3 compared with the results of the etching of the oxide film performed with a prior art apparatus. More specifically, FIG. 3 illustrates relationships between the high-frequency power applied to the substrate 5 and the etching rate (nm/min.) with the microwave powers being used as parameters. As will be seen from FIG. 3, remarkably increased etching rate can be attained when compared with the prior art apparatus.

The specimen, as well as the etching conditions adopted in the measurements mentioned above, are as follows:

(1) Specimen: Si-substrate having a thermally grown oxide film formed on a surface, (2) Atmospheric gas: Ar-gas at $10^{-2}$ to $10^{-3}$ Torr, (3) Microwave power: 200 W and 400 W changed over in the two measurements, respectively, (4) High-frequency power: 1.2 kW at maximum.

Next, sputter etching apparatuses according to other embodiments of the present invention will be described by referring to FIGS. 4 to 10.

Figure 4:
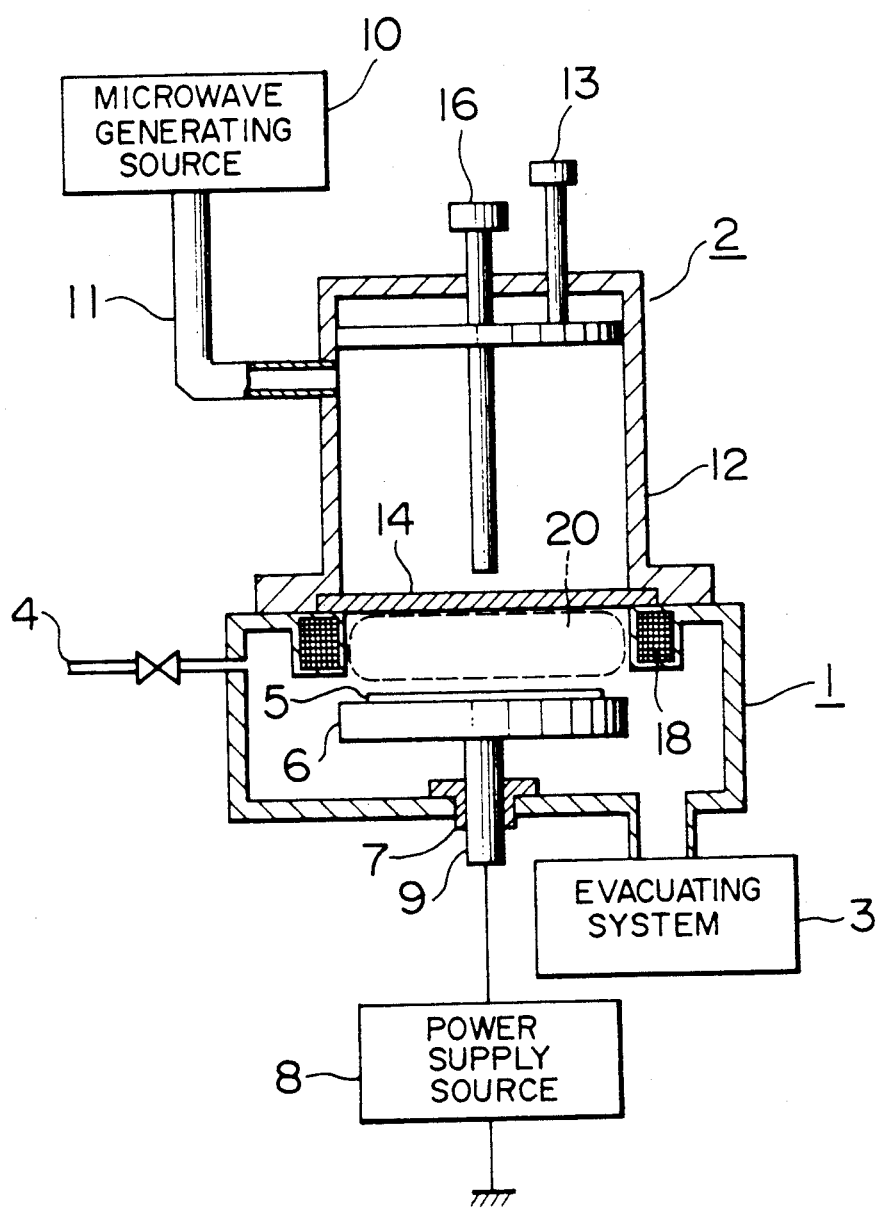
FIG. 4 shows in a partially sectioned side elevational view a sputter etching apparatus according to a third embodiment of the present invention.

FIG. 4 shows a sputter etching apparatus according to a third embodiment of the present invention. This apparatus is composed of a vacuum chamber 1, a plasma generating unit 2, an evacuating system 3 and a gas supply system 4. Disposed fixedly within the vacuum chamber 1 is a sputter etching electrode (hereinafter called simply as etching electrode) 6 on which a substrate 5 to be etched by sputtering is disposed and which electrode is mounted in the vacuum chamber 1 through an interposed flange 7 serving to electrically isolate the vacuum chamber 1 from the etching electrode 6 in a vacuum-tight manner. The etching electrode 6 has a projection 9 extending outwardly and connected electrically to a power supply source 8. The plasma generating unit generally denoted by the numeral 2 is constituted by a microwave generating source 10, a waveguide 11, a cavity 12, a matching element 13, an electrically conductive bar 16 and a microwave injection or radiation window 14 through which the microwave is introduced into the vacuum chamber 1. Additionally, magnets 18 are disposed around a space defined between the injection window 14 and the etching electrode 6.

Figure 5:
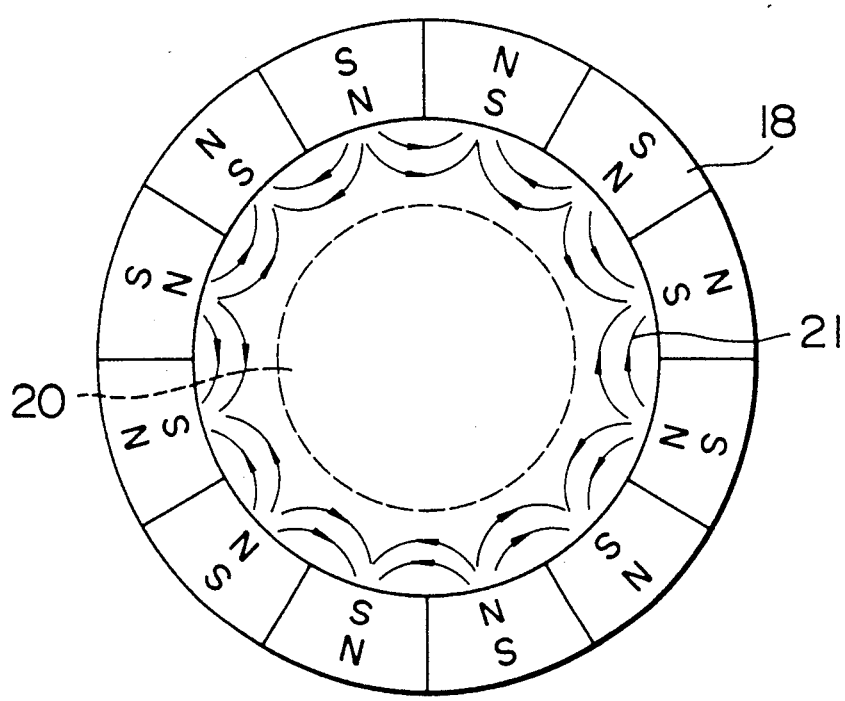
FIG. 5 is a plan view of a ring-like magnet array employed as the magnetic field generator for confining a plasma within a defined space in the sputter etching apparatus shown in FIG. 4.

With the structure of the sputter etching apparatus described above, a microwave is generated by the microwave generating source 10 to be fed into the cavity 12 by way of the waveguide 11. Through adjustment of the matching member 13, there can be established in the cavity 12 the conditions for the resonance cavity for the microwave, as the result of which the electric field of the microwave within the cavity 12 is intensified. The atmospheric gas fed into the vacuum chamber 1 from the gas supply system 4 is ionized under the action of the microwave introduced into the vacuum chamber 1 through the inlet window 14, whereby a plasma 20 is produced. A sectional view taken in the direction thicknesswise of the magnets 18 disposed around the periphery of the plasma 20 is shown in FIG. 5. Parenthetically, it should be mentioned that although the magnets 18 are shown as constituted by permanent magnets in the instant embodiment, these magnets 18 can of course be implemented as electromagnets. Referring to FIG. 5, an even number of the magnets 18 are arrayed in a ring-like form with divisions in the circumferential direction. The polarities of these magnets at inner and outer peripheral poles thereof are alternately exchanged from one to another so that magnetic lines of force run along inwardly bulging paths (the magnetic field of such pattern is referred to as the multi-cusp magnetic field commonly employed for confining the plasma). By virtue of this arrangement of the magnets, the plasma 20 is confined within a definite space located above the substrate 5, whereby the plasma 20 can be easily produced not only with high stability even in a low vacuum range but also with a high density. Further, the density of the plasma 20 can be controlled up to a limit value at which the microwave can no longer transfer energy to the plasma 20 in the course of propagation therethrough, by correspondingly controlling the microwave power as inputted. (By way of example, the plasma density can be increased up to $7.4 \times 10^{10}/cm^3$ at the microwave frequency of 2.45 GHz.) Ions of the plasma produced in this way are accelerated under the voltage applied to the substrate 5 by way of the etching electrode 6 from the power supply source 8 thereto (in this illustrative case, a high-frequency power is applied), whereby the ions are caused to impact against the substrate 5. Thus, the sputter etching of the substrate 5 takes place. It should be mentioned that by dimensioning the cavity 12 so that the axis-symmetrical mode of microwave prevails within the cavity 12, there can be realized a uniform distribution of density of the plasma 20 over the substrate 5. The cavity 12 is of a coaxial type in which the electrically conductive bar 16 is mounted at the center of the cavity. It should however be noted that similar effects can be obtained with the cavity of other type where no coaxial conductive bar is employed.

In the foregoing description, it has been assumed that the inlet or injection window 14 is formed of a quartz plate. However, this window may also be formed of any insulation material such as a ceramic exemplified by alumina or the like which has impermeability to gases and is less susceptible to absorption of the microwave, since the microwave injection window 14 must serve also as a partitioning wall between the cavity 12 and the vacuum chamber 1.

Figure 6:
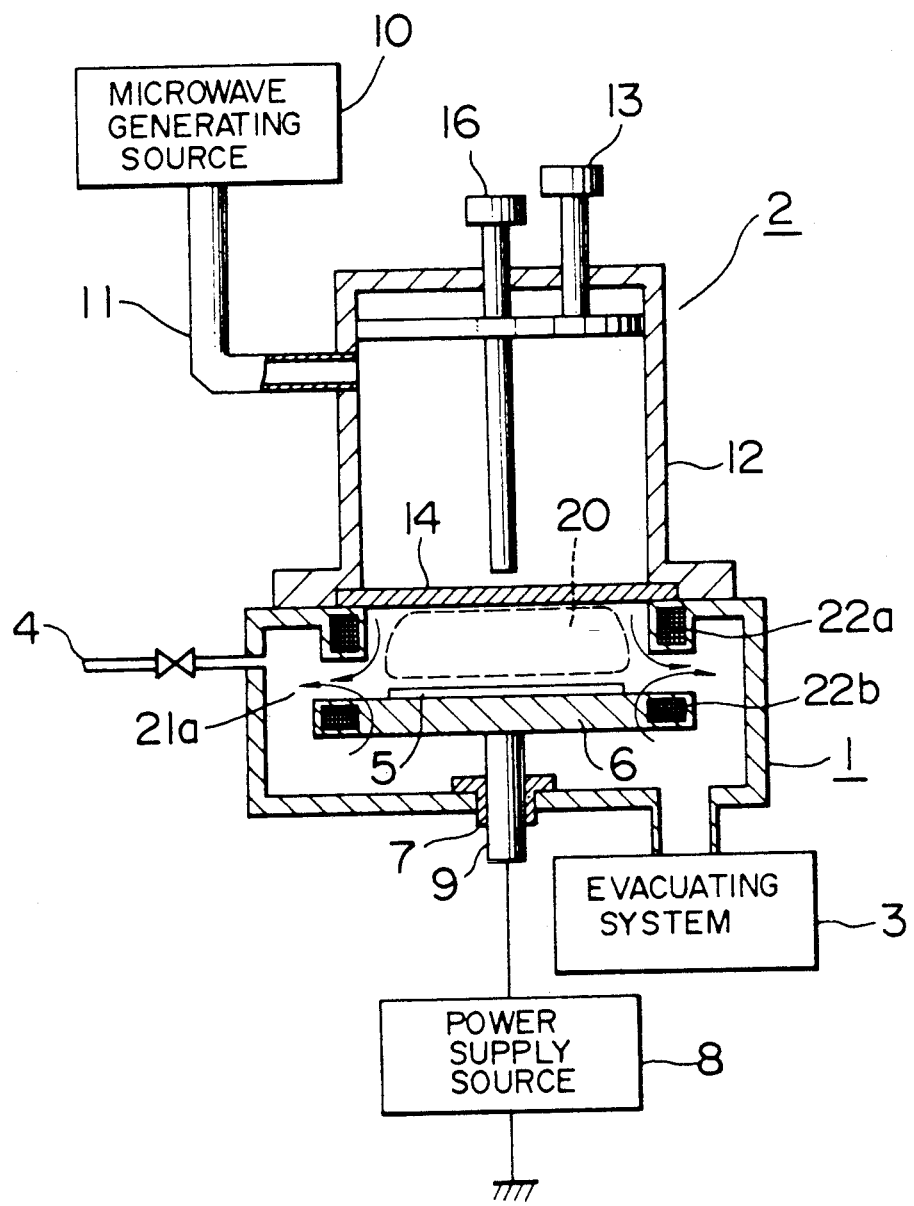
FIG. 6 shows in a partially sectioned side elevational view a sputter etching apparatus according to a fourth embodiment of the present invention.

FIG. 6 shows a sputter etching apparatus according to a fourth embodiment of the present invention. This apparatus is composed of a vacuum chamber 1, a plasma generating unit 2, an evacuating system 3 and a gas supply system 4 in a structural configuration substantially similar to the third embodiment described above in conjunction with FIG. 4 except for a difference that ring-like coils 22a and 22b are employed in place of the ring-like magnet array 18 in the third embodiment. More specifically, the ring-like coils 22a and 22b are disposed coaxially in two stages in the vertical direction and are supplied with electric currents in of opposite directions so that the magnetic lines of force produced by these two coils are closed to each other around a definite space over the substrate 5, whereby the plasma can be confined within the space without diffusing outwardly in the radial direction. In other words, confinement of the plasma can be realized stably, whereby the plasma of high density can be produced with high efficiency.

Figure 7:
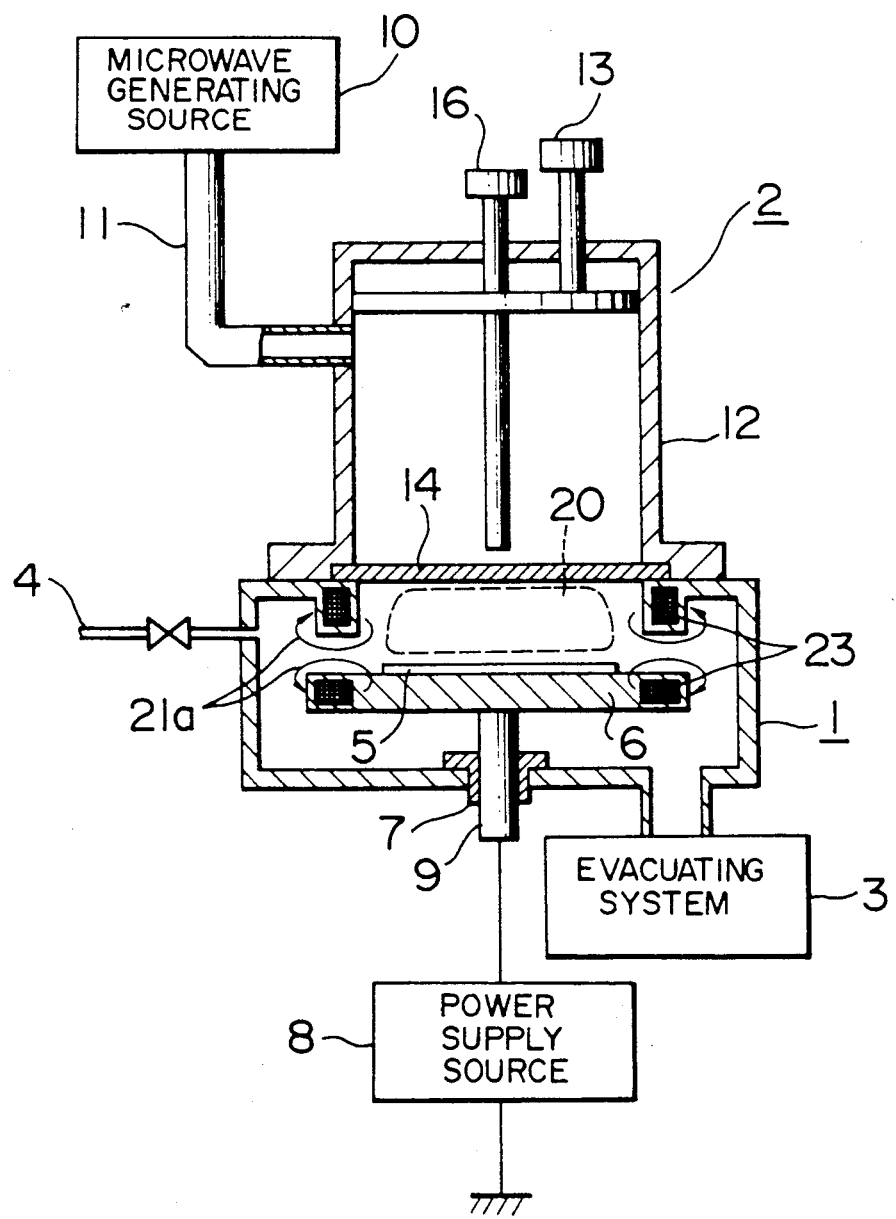
FIG. 7 shows in a partially sectioned side elevational view a sputter etching apparatus according to a fifth embodiment of the present invention.
Figure 8:
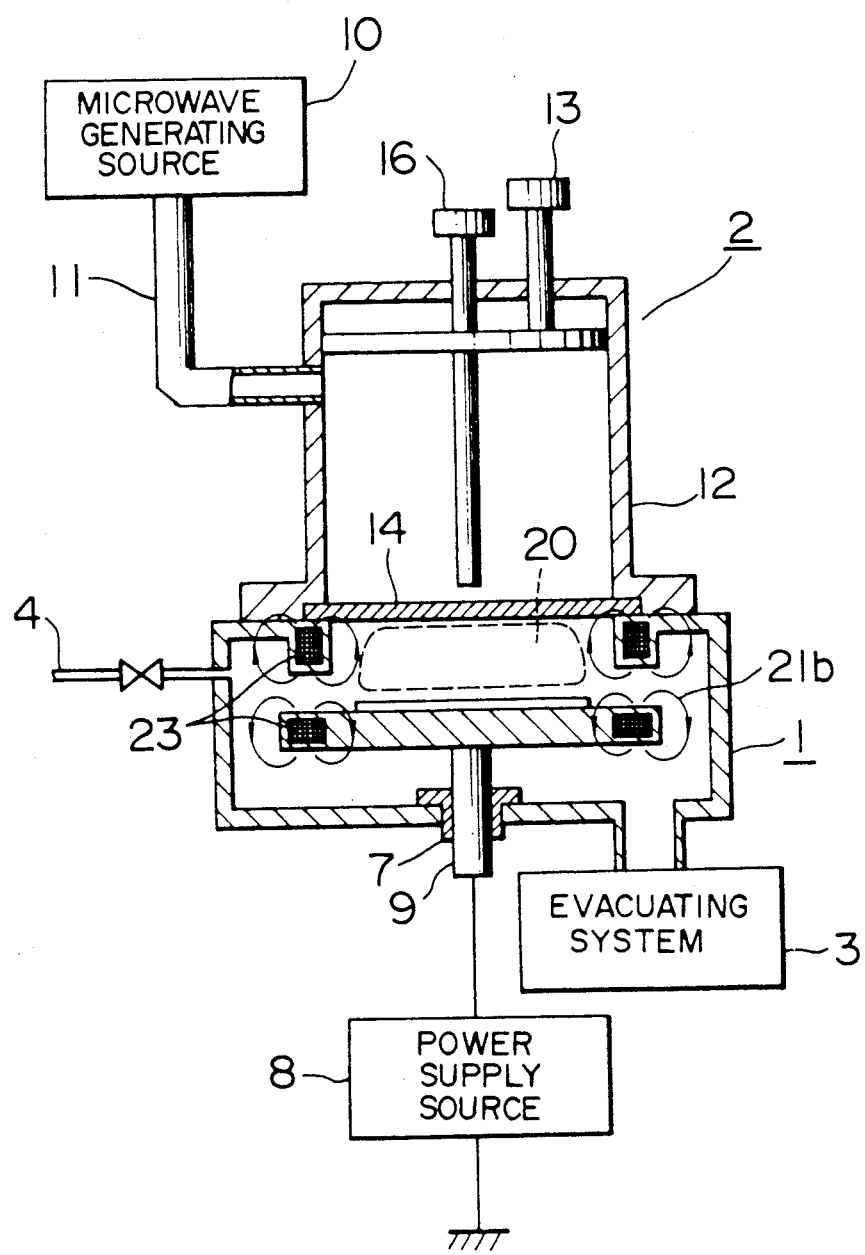
FIG. 8 shows in a partially sectioned side elevational view a sputter etching apparatus according to a sixth embodiment of the present invention.

FIGS. 7 and 8 show fifth and sixth embodiments of the present invention each having a structure similar to that of the fourth embodiment shown in FIG. 6 except that the two stages of coils 22a and 22b are replaced by a pair of ring-like permanent magnets 23. More specifically, in the case of the sputter etching apparatus shown in FIG. 7, the paired ring-like permanent magnets 23 arrayed vertically are magnetized in opposition to each other in the circumferential direction of the ring, as indicated by arrows 21a. With such an arrangement of the paired permanent magnet rings 23, the magnetic lines of force generated by the magnet rings are closed to each other around the space over the substrate 5 to thereby confine the plasma 20 within that space. In contrast, in the case of the structure shown in FIG. 8, the paired ring-like magnets 23 are magnetized opposite to each other in the thicknesswise direction, as indicated by arrows 21b. Also with this arrangement, a substantially similar effect as that of the apparatus shown in FIG. 7 can be obtained. In other words, the plasma 20 is effectively confined within the space over the substrate 5.

Figure 9:
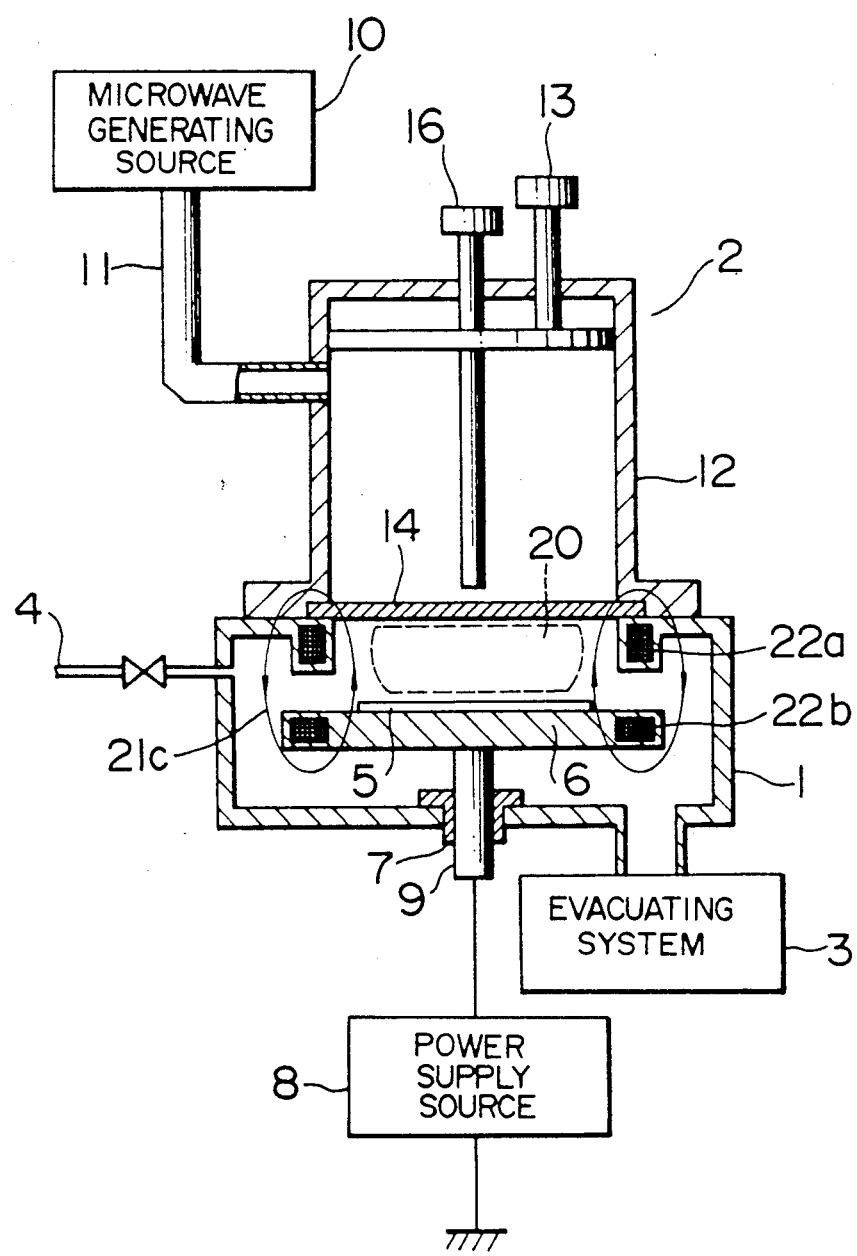
FIG. 9 shows in a partially sectioned side elevational view a sputter etching apparatus according to a seventh embodiment of the present invention.

FIG. 9 shows another embodiment of the present invention which is implemented in the same structure as that of the embodiment shown in FIG. 6. More specifically, in the case of this embodiment, a pair of ring-like coils 22a and 22b are employed as the magnetic field generator as in the case of the embodiment shown in FIG. 6. However, the difference from that embodiment is seen in that both coils 22a and 22b are so connected as to conduct the respective electrical currents in the same direction so that the magnetic lines of force generated by both coils 22a and 22b bulge inwardly, as indicated by arrows 21c, to thereby prevent the plasma 20 from diffusing radially outwardly.

Figure 10:
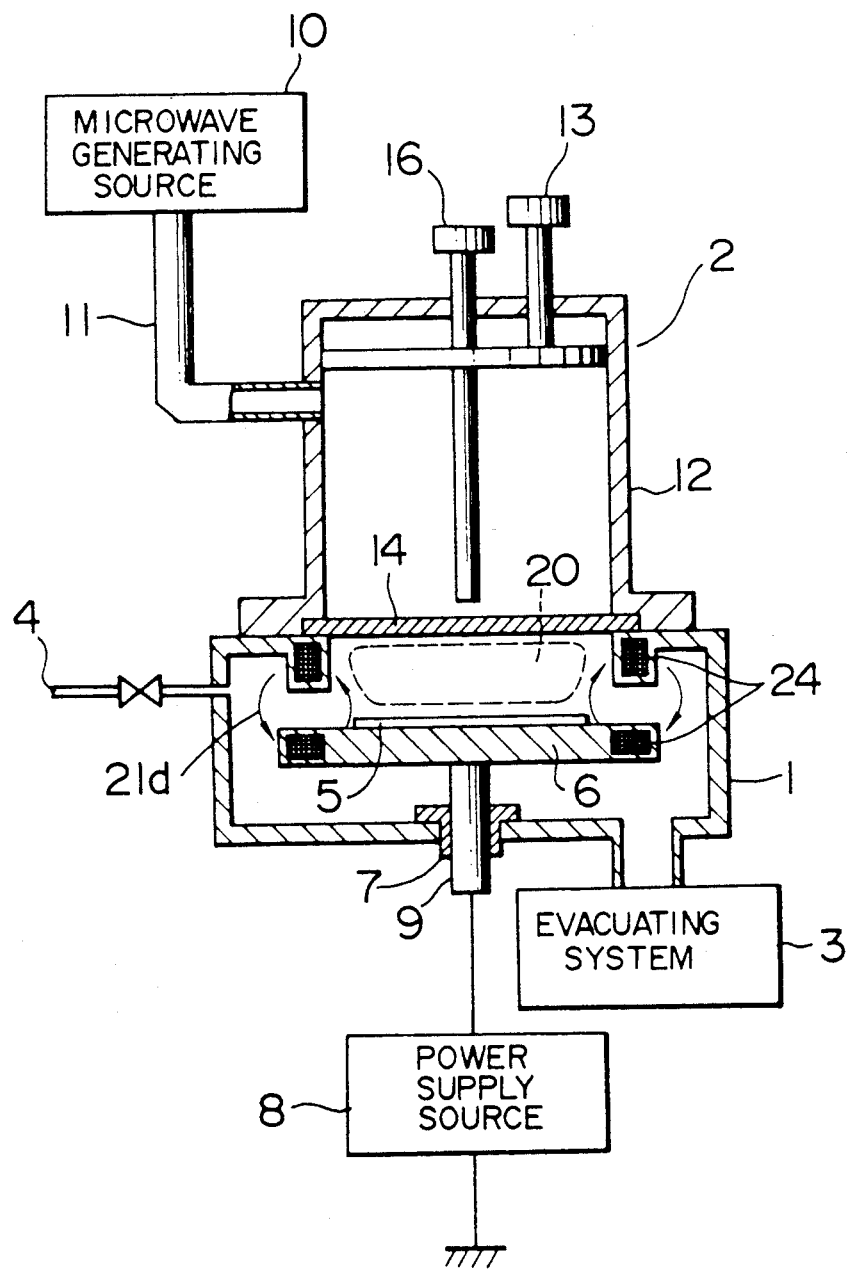
FIG. 10 shows in a partially sectioned side elevational view a sputter etching apparatus according to an eighth embodiment of the present invention.

FIG. 10 shows another embodiment of the present invention which is similar to the embodiment shown in FIG. 9 except that the paired coils 22a, 22b are replaced by paired ring-like magnets generally denoted by 24. The paired ring-like magnets 24 are magnetized in the radial direction with opposite polarities to each other. The magnetic field pattern indicated by arrows 21d is substantially similar to the pattern of the magnetic field generated in the apparatus shown in FIG. 9. Thus, the embodiment of FIG. 10 can exhibit the effect of confining the plasma 20 within the space over the substrate 5.

Figure 11:
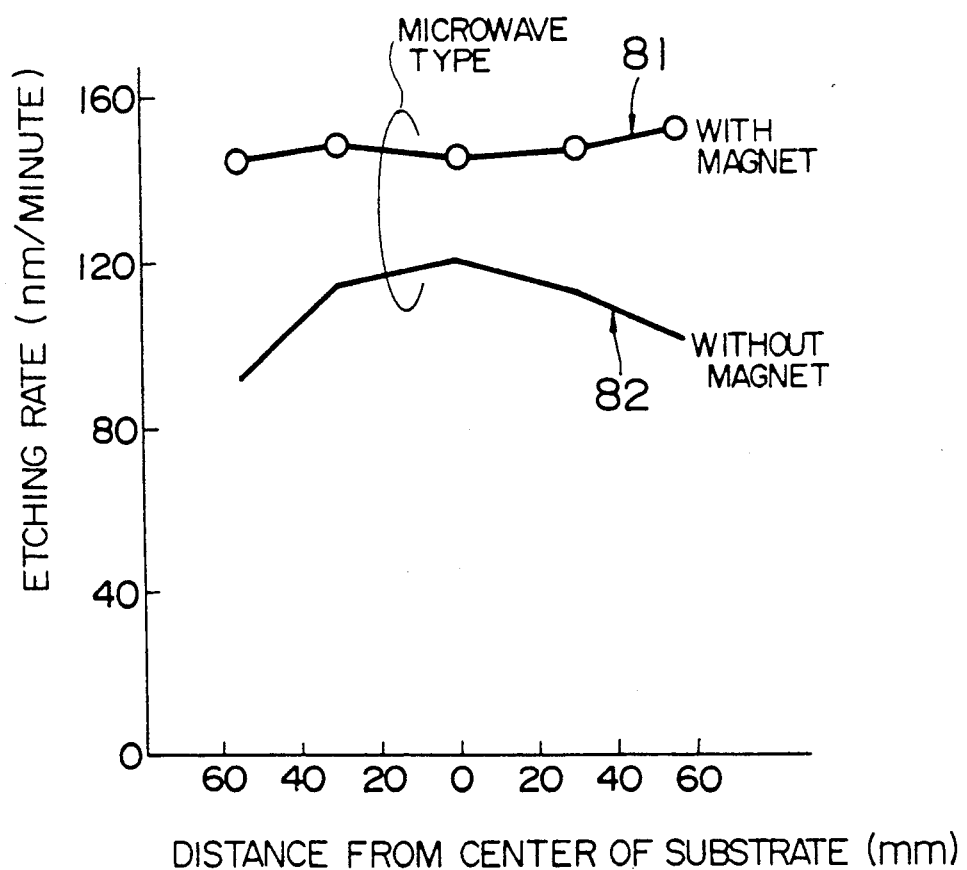
FIG. 11 is a view for graphically illustrating a relationship between the etching rate and the distance from the center of a substrate in the sputter etching apparatus equipped with a plasma confining magnet system comparatively with an apparatus without such a magnet system.

The result of the sputter etching performed on the substrate 5 consisting of a silicon wafer having a thermally grown oxide ($SiO_2$) film formed over a surface thereof by using the sputter etching apparatus of the structure shown in FIG. 4 is illustrated in FIG. 11 in comparison with the result of the sputter etching carried out with an apparatus equipped with no magnetic-field generator means. In FIG. 11, etching rate is taken along the ordinate with the distance from the center of the wafer being taken along the abscissa.

| Etching Conditions | |
|---|---|
| Substrate: | silicon wafer having a thermally grown oxide ($SiO_2$) film. |
| Etching gas: | argon (Ar), |
| Pressure: | $5 \times 10^{-3}$ Torr. |
| Microwave power: | 400 W, |
| High-Frequency Power: | 600 W (applied to the sputter etching electrode). |

As will be seen from the illustration in FIG. 11, a curve 81 representative of the etching rate realized with the apparatus equipped with the plasma confining magnet array is in a relatively flat form over the distance extending from the center of the wafer to the periphery thereof, demonstrating that the uniformity in the etching rate is improved. On the other hand, a curve 82 representative of a control case where no magnet array is employed shows that the etching rate is decreased toward the periphery of the wafer, indicating a significant difference in the etching rate at the center portion of the wafer.

Figure 12:
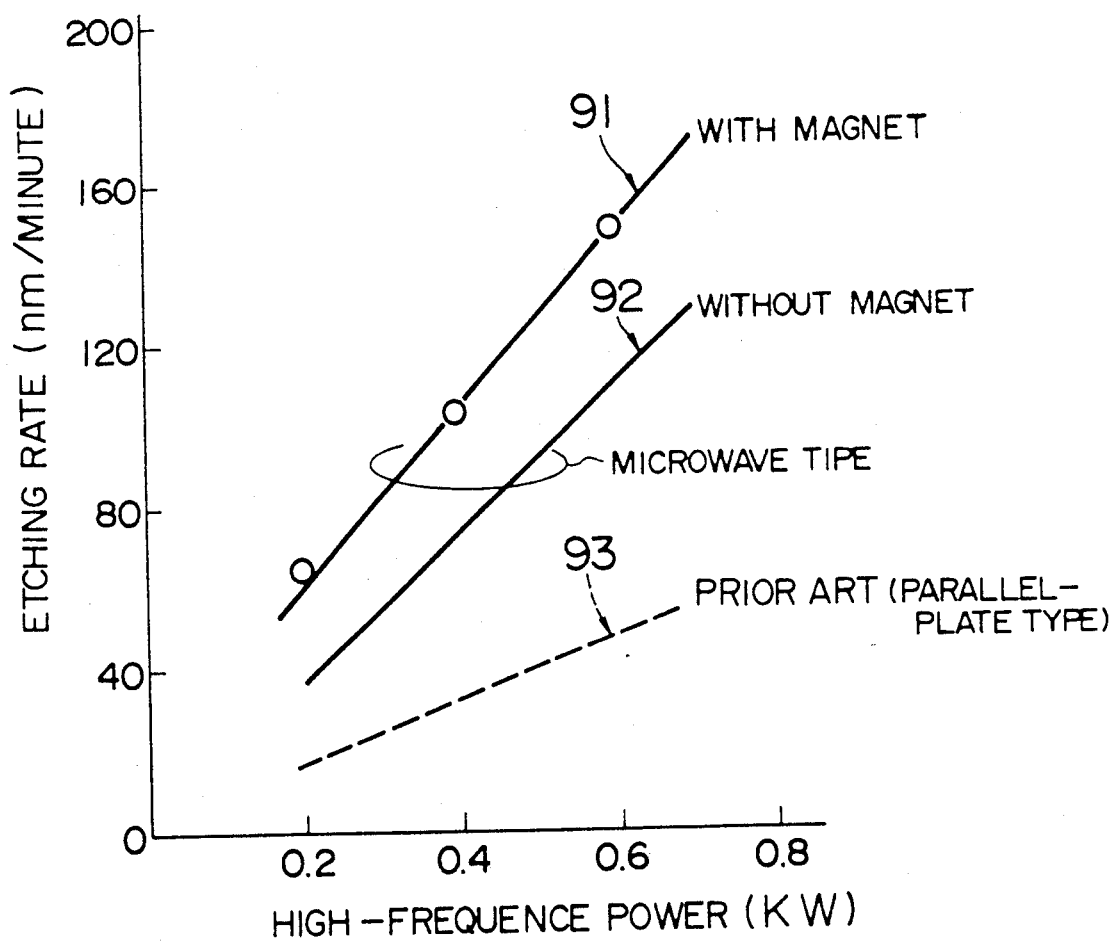
FIG. 12 is a view for graphically illustrating a relationship between the etching rate and the high-frequency power in the sputter etching apparatus according to the present invention comparatively with that of a prior art apparatus.

FIG. 12 shows relationship between the etching rate and the high-frequency power applied to the sputter etching electrode 6 under the same etching conditions as those for FIG. 11. A curve 91 represents the relation obtained with the sputter etching apparatus equipped with the magnet array according to the invention, a curve 92 represents the etching rate obtained with the apparatus having no plasma confining magnet array and a curve 93 represents the etching rate attained with the prior art parallel plate type apparatus having no microwave plasma generator. As will be seen in FIG. 11, the curve 91 shows that the etching rate or speed can be significantly increased according to the embodiments of the present invention equipped with the plasma confining magnet array over the other examples for control.

The etching conditions for the measurements mentioned above are as follows:

| Substrate: | silicon wafer having a thermally grown oxide ($SiO_2$) film formed on a surface, |
|---|---|
| Etchant gas: | argon (Ar), |
| Pressure: | $5 \times 10^{-3}$ Torr. |
| Microwave power: | 400 W (in the case of the curves 91 and 92). |

As will be understood from the characteristic curves mentioned above, diffusion of the plasma is positively prevented by employment of the magnet(s) or coil(s) in the manner described hereinbefore, whereby the plasma density at the peripheral portion in particular is increased, resulting in that the sputter etching rate on an average is increased. Among the others, the sputter etching rate at the peripheral portion of a substrate which has presented a problem in the prior art can be increased with the uniformity in the sputter etching rate being simultaneously enhanced. It has been found from currently available data that the deviation in the sputter etching rate between center portion and the peripheral portion is in the range of $\pm 5\%$ in the case of the treatment carried out with the sputter etching apparatus equipped with the magnetic field generator according to the present invention, while in the control case where there is no magnetic field generator, the deviation amounts to $\pm 20\%$.

As will now be appreciated from the foregoing description, it is possible according to the teaching of the present invention that the plasma can be produced at a high density by means of a plasma generating unit operative based on the microwave. Further, by implementing the cavity as a microwave cavity resonator of the axis-symmetrical mode by adjusting the dimension of the cavity by means of the matching element 13 and the coaxial electrically conductive bar 16, there can be produced a stable plasma of high density in an axis-symmetrical form, whereby the speeding-up of etching operation and reduction of damage to the substrate can be achieved.

Besides, since the generation of plasma can be controlled by correspondingly controlling the microwave power while energy at which ions in the plasma impact against the substrate can be controlled independently from the microwave power control by providing separately a second power supply source 8 for applying the high-frequency power to the etching electrode 6, the etching rate and the ion impact energy can be controlled separately from each other. This implies that the optimum etching conditions can be selected for each substrate to be treated, which in turn results in an increased yield of the sputter-etched substrates.

Additionally, by virtue of the previously mentioned arrangement that the plasma is produced with high density by utilizing the microwave with the cavity dimension being so adjusted by the cavity matching element 13 and the coaxial stud 16 that the microwave cavity resonator of axis-symmetrical mode is realized and that diffusion of plasma at the peripheral portion thereof is prevented by the magnetic field, there can be produced a stable plasma exhibiting axis-symmetry with high density even at a low vacuum level, whereby the etching can be carried out on at an increased speed while decreasing the possibility of injury to the substrate, because the radially outward diffusion of the plasma at the peripheral portion thereof can be positively prevented by the magnetic field.

Figure 13:
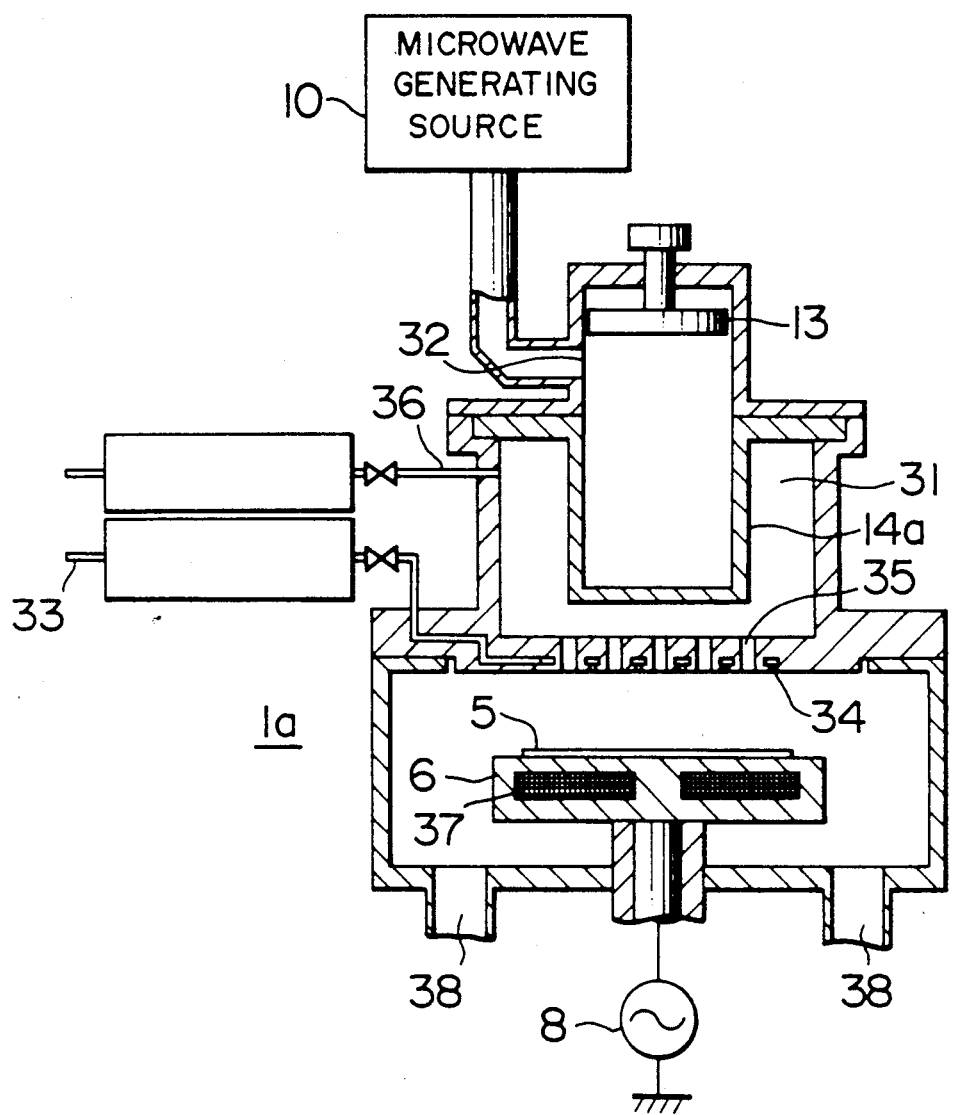
FIG. 13 shows in a partially sectioned side elevational view a plasma treatment apparatus according to a ninth embodiment of the present invention.
Figure 14:
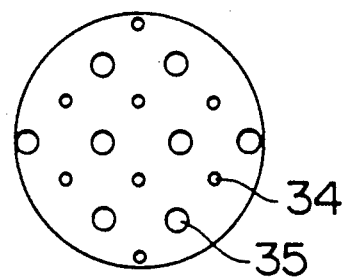
FIG. 14 is a bottom plan view showing a structure of a partitioning plate disposed at the boundary between an activating chamber and a reaction chamber of the apparatus shown in FIG. 13.

Now, a plasma treatment apparatus according to yet another embodiment of the present invention will be described by referring to FIGS. 13 and 14. In FIG. 13, a reference numeral 31 denotes an activating chamber having a microwave inlet window 32 and a microwave introducing or injection member 14a formed of a material such as quartz, alumina or the like which has a vacuum sustaining capability and transmissibility to the microwave. The microwave injection member 14a projects inwardly of the activating chamber 31 which constitutes a cavity resonator for the input microwave and is adapted to be varied in its dimension by means of a plunger 13 serving as the matching means. The activating chamber 31 has a bottom wall or plate provided with a plurality of blow-out holes 35. Further, a first feed port 36 for a reactant gas is connected to the activating chamber 31 in the vicinity of the microwave inlet window 32.

Mounted under the outlet portion of the activating chamber 31 constituted by the blow-out holes 35 is a reaction chamber 1a which has a bottom formed with evacuation ports 38. Mounted within the reaction chamber 1a at the center portion thereof is a supporting stage 6 on which a substrate 5 to be treated is disposed. The stage 6 incorporates a heater 37 so that the temperature of the stage 6 can be set at a desired value. The stage 6 and hence the substrate 5 is electrically insulated from the reaction chamber 1a and electrically connected to a high-frequency power supply source 8. The bottom wall of the activating chamber 31 provided with the blow-out holes 35 so as to face toward the substrate 5 is further provided with a plurality of gas supply holes 34 formed alternately with the blow-out holes 35 (in such a manner as illustrated in FIG. 14), wherein the gas supply holes 35 are communicated to a second gas supply header or port 33. Installed in association with the activating chamber 31 on the side of the microwave inlet window 32 a microwave generating source 10 equipped with a tuner for establishing the matching between the activating chamber 31 and the incident microwave and a monitor for measuring powers of the incident microwave and reflected microwave.

With the abovementioned structure of the plasma treatment apparatus according to the embodiment of the present invention in FIG. 13, a gas difficult to activate (e.g. $N_2O$ or $O_2$ in the case of the substrate to be deposited with an oxide film of $SiO_2$ or $N_2O$ for the substrate to be deposited with a $Si_3N_4$-film) is supplied to the activating chamber 31 through the gas supply port 36. Also, a gas easy to activate (e.g. $SiH_4$ gas for the substrate to be formed with a $SiO_2$ or $Si_8N_4$ film) is supplied through the gas supply port 33 to the reaction chamber 1a. In the meanwhile, the reaction chamber 1a and the activating chamber 31 are evacuated to a predetermined vacuum. Starting from this state, the microwave generating source 10 is turned on. By establishing the matching between the microwave as supplied and the activating chamber 31, the microwave is introduced into the activating chamber 31 through the microwave injecting member 14a, as the result of which a standing microwave is formed within the activating chamber 31. Under the effect of the resulting electric field, the reaction gas supplied from the gas supply port 36 is ionized, giving birth to a plasma. In this connection, it should be noted that the microwave penetrates into the activating chamber 31 through the whole wall of the microwave injecting member 14a to thereby supply energy to the plasma of the reactive gas, whereby the plasma of high density (e.g. $7.4 \times 10^{10}/cm^3$) can be formed along and over the whole outer surface of the projecting portion of the microwave injecting member 14a. The reactive gas activated by this plasma is fed to the reaction chamber 1a in uniformly distributed flows through the blow-out holes 35, accompanying the evacuation through the exhaust ports 38. Together with the reactive gas activated as described above, the gas easy to activate is supplied through the gas supply holes 34 directly into the reaction chamber 1a. They undergo reaction on the surface of the substrate 51 are heated to a predetermined temperature by the heater 37 through the plasma produced over the substrate 5 under the effect of the high-frequency power supplied from the high-frequency power supply source 8, whereby a film is deposited on the surface of the substrate 5.

As will be appreciated from the above elucidation, with the structure of the apparatus according to the instant embodiment, the plasma generating area within the activating chamber 31 can be increased while enlarging the microwave energy transfer area for the plasma, whereby microwave energy is absorbed with high efficiency by the plasma. Thus, a high-density plasma of a large volume can be produced within the activating chamber 31, as the result of which activated reactive gas of high concentration can be produced and transported uniformly toward the substrate 5 (specimen to be treated) over a short distance while maintaining the high concentration to undergo reaction at a significantly increased rate with the reactive gas activated by the plasma produced above the substrate 5. In this way, film formation can be accomplished at high speed without incurring any deterioration in the film quality.

Figure 15:
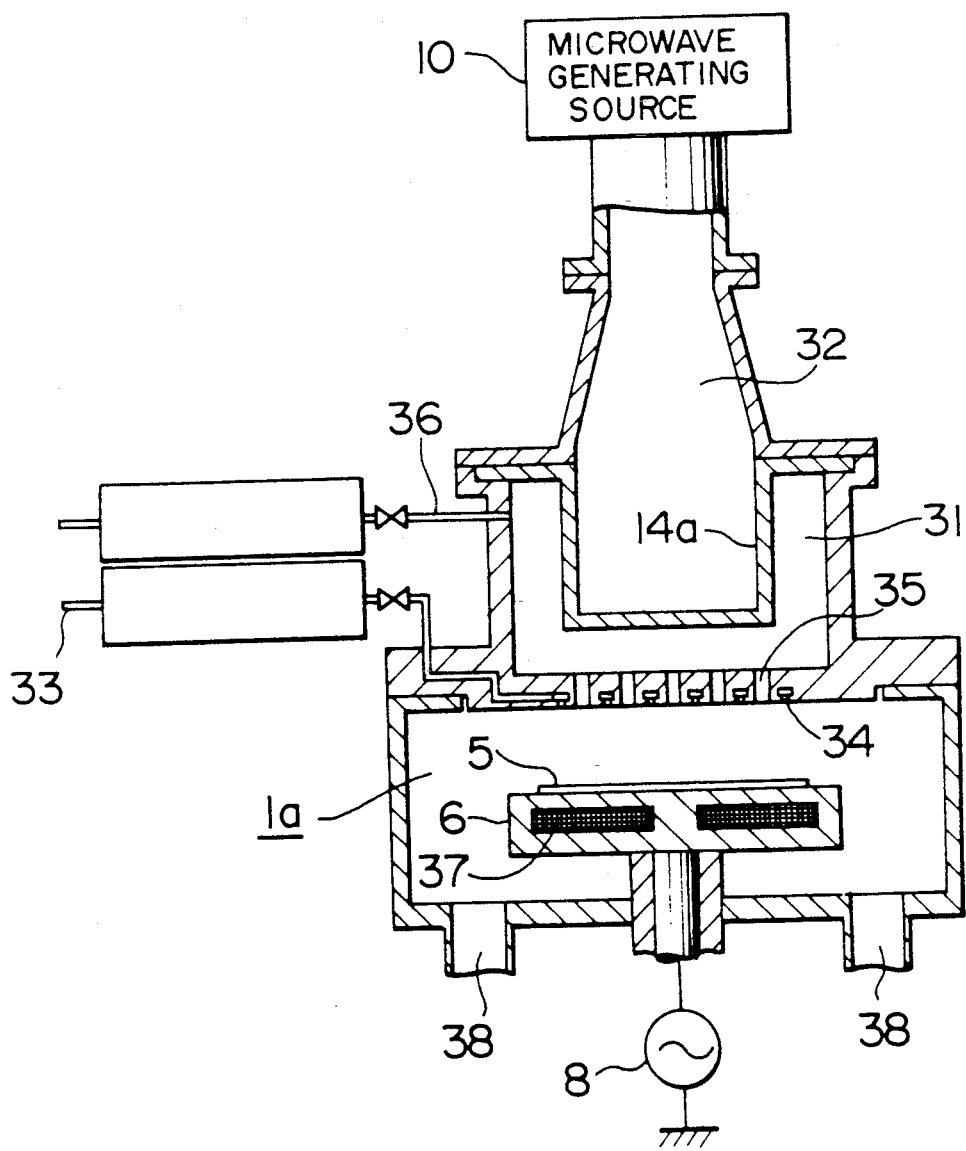
FIG. 15 shows in a partially sectioned side elevational view a plasma treatment apparatus according to a tenth embodiment of the present invention.

FIG. 15 shows still another embodiment of the present invention. According to this embodiment, the microwave inlet port to be connected to the activating chamber 31 is provided at the top of that chamber with the matching plunger 13 being removed. With the structure shown in FIG. 15, the adequate resonance state is rather difficult to establish because of absence of the matching plunger, whereby reflection power is likely to increase to a disadvantage. However, the microwave introducing or injecting portion can be implemented in a simplified structure. Besides, the electrode as a whole can be realized in a reduced size. It has further been established that similar effects to those of the apparatus shown in FIG. 13 can be obtained in respect to the operation characteristics. The easy to activate gas is not exposed to the previously mentioned microwave-ionized plasma but activated by the plasma generated by a high-frequency power of a low level applied to the stage or electrode 6 to be thereby fed uniformly over the specimen to be treated to undergo reaction with the plasma generated by the microwave. Consequently, there arises no need for application of high power for increasing the density of plasma produced above the substrate. Further, such situation in which concentration only of the activated gas which is easy to activate is increased can be evaded, whereby the reaction at a rate approximating to the stoichiometrical rate is increased. Thus, the formation of film is accomplished at a high speed without involving deterioration in the film quality. Besides, the gases excited by the microwave plasma and the high-frequency plasma, respectively, can be uniformly fed onto the substrate 5 under treatment. This contributes to formation of a highly uniform film of improved quality at a high speed.

The plasma treatment apparatus described above includes two chambers, i.e. an activating chamber 31 and a reaction chamber 19 in which a substrate or specimen 5 to be treated is contained. Within the activating chamber 31, plasma of high density on the order of $7.4 \times 10^{10}/cm^3$ can be produced due to the discharge of the microwave. Because of absence of any magnetic field, the microwave can no longer propagate through the plasma when the high plasma density mentioned above is attained and is reflected at the boundary surface of the plasma, making it impossible to further increase the plasma density. In this connection, however, it should be appreciated that implementation of the microwave injection member 14a in the convex-like projecting structure contributes to increasing in the area over which the microwave is brought into contact with the plasma, whereby the volume of plasma is correspondingly increased. Further, by designing the activating chamber 31 so as to satisfy the resonance condition, ignition of plasma as well as generation of stable plasma is facilitated. Consequently, activation of the gas which is inherently difficult to activate and supplied into the activating chamber 31 can be enhanced in an arbitrary manner.

A structure of a flat plate or wall provided at the boundary between the activating chamber 31 and the reaction chamber 1a makes it possible to supply the difficult to activate gas activated in the activating chamber 31 and the easy to activate reactive gas uniformly over the specimen 5 to be treated. With this structure, the distance between the activating chamber 31 and the substrate 5 to be treated can be shortened. For realizing the supply of the activated gas from the activating chamber 31 uniformly toward the substrate 5 to be treated without lowering concentration of the activated gas, a plurality of gas blow-out holes 34 are formed in the boundary plate or wall mentioned above in the direction facing toward the substrate 5. The activating chamber 31 is located in opposition to the substrate 5 across the boundary plate.

It should again be mentioned that the gas activated in the activating chamber 31 is such species of gas which is inherently difficult to activate. On the other hand, the gas easy to activate is supplied to the reacting chamber 1a directly over the substrate 5 without passing through the activating chamber 31 to be activated by the plasma which is produced above the substrate 5 by the high-frequency power of a low level applied to the substrate 5 by way of the electrode 6. For ensuring the uniform supply of the gas easy to activate to the substrate 5, a plurality of holes 34 connected to the gas supply port 33 are formed in the boundary plate alternately with the blow-out holes 35 which communicate with the activating chamber 31.

By virtue of the structural arrangement described above, concentration of the activated gas of the species difficult to activate can be increased independently. The gas thus activated in the activating chamber 31 can be supplied uniformly over the substrate 5 without lowering the concentration. On the other hand, the gas easy to activate can be activated only by the plasma of a low power above the substrate 5 without need for increasing the density through the action of the microwave. Thus, it is possible to properly control the ratio of concentrations of the plural activated gases so that formation of the film can be realized at an increased speed. Uniformity of the gas supply to the substrate or specimen 5 to be treated can be assured by the boundary plate provided with the gas discharge holes 34 and 35 formed so as to face toward the specimen 5.

Within the reaction chamber 1a, the gas easy to activate as introduced through the holes 34 formed in the boundary plate is activated by the low density plasma produced over the substrate 5 and reacts with the activated gas originating in the activating chamber 31 on the surface of the substrate to form a film by deposition.

In this manner, the reactant gases can be activated independent of each other by the separate plasmas and supplied uniformly to the substrate with high efficiency, whereby the film of high quality can be formed uniformly at an increased speed.

As will now be appreciated from the foregoing description, in the apparatus according to the invention, the activating chamber for activating a reactant gas and a reaction chamber for treating a sample or specimen are provided independent of each other, wherein the activating chamber is realized as the cavity resonator for the incident microwave so as to generate plasma stably even in a low vacuum range (lower than 1 Torr). The microwave introducing or injection member 14a is so mounted as to project at least partially into the interior of the activating chamber 31 for the purpose of increasing the area over which the plasma as produced is brought into contact with the microwave. By virtue of this arrangement, a large volume of plasma of the reactant gas can be generated along and over the projecting surface of the microwave injecting member 14a with high density on the order of $7.4 \times 10^{10}/cm^3$ at the microwave frequency of 2.45 GHz. The reactant gas is fed into the plasma of high density, whereby even the gas which is inherently difficult to activate can be activated to a high concentration in the course of passing through the plasma over relatively long distance. The gas thus activated is introduced into the reactor chamber 1a through blow-out holes 35. Because of the short distance to the specimen to be treated as well as low vacuum in the reaction chamber and uniform distribution of the blow-out holes 35, the activated gas can be uniformly fed toward the specimen under treatment.

What is claimed is:

1. A plasma treatment apparatus comprising:
   a microwave generating source generating a microwave;
   a waveguide feeding the microwave;
   a cavity resonator resonating the microwave fed along the waveguide so that an electric field of the microwave is intensified;
   a gas supply source;
   an evacuator;
   a vacuum chamber connected to said gas supply source and said evacuator, said vacuum chamber providing a plasma treatment electrode supporting a substrate thereon;
   a microwave injection window supplying a microwave energy resonated in said cavity resonator so as to generate plasma by the microwave energy, wherein the plasma is disposed against the substrate in the vacuum chamber, the microwave injection window being interposed between said cavity resonator and said vacuum chamber so that the microwave injection window is provided in opposition to said substrate;
   a first voltage supply provided in association with said plasma treatment electrode causing ions in said plasma to impact against said substrate; and
   magnetic field generator generating a magnetic field in such a manner that said plasma produced within a space defined between said substrate and said microwave injection window is peripherally surrounded by a magnetic line of force so as to prevent said plasma from diffusing radially and outwardly.

2. A plasma treatment apparatus according to claim 1 wherein said first voltage supply comprises a high-frequency power source for applying a high-frequency electric power to said plasma treatment electrode.

3. A plasma treating apparatus according to claim 1 wherein said magnetic field generator is provided adjacently along a circumference of said microwave injection window on a side facing said vacuum chamber.

4. A plasma treatment apparatus according to claim 3 wherein said magnetic field generator is arrayed in a ring-like form with divisions in the circumferential direction.

5. A plasma treatment apparatus according to claim 1 wherein said cavity resonator is further provided with matching means for serving as the cavity resonator for said microwave.

6. A plasma treatment apparatus according to claim 1 wherein said magnetic field generator is formed by a magnet ring.

7. A plasma treatment apparatus according to claim 1 wherein said magnetic field generator is formed by a magnet coil.

8. A plasma treatment apparatus according to claim 1 wherein said cavity resonator is formed in a coaxial structure.

9. A plasma treatment apparatus according to claim 1 wherein said magnetic field generator is formed by at least a pair of magnetic field generating devices so as to form a magnetic field having a cusp-like profile.

10. A plasma treatment apparatus according to claim 9 wherein said at least a pair of magnetic field generating devices are provided adjacently on a circumference of said microwave injection window on a side facing said vacuum chamber and on a circumference of said plasma treatment electrode.

11. A plasma treatment apparatus according to claim 1 wherein said cavity resonator is so dimensioned that said microwave exhibits an axis-symmetrical mode.

12. A plasma treatment apparatus according to claim 1 wherein said microwave injection window is formed of an electrically insulating material less susceptible to absorption of the microwave to serve as a partition wall to define said vacuum chamber and to transmit the microwave into said vacuum chamber.

13. A plasma treatment apparatus according to claim 12 wherein said electrically insulating material is selected from a group consisting of quartz and ceramics.

14. A plasma treatment apparatus comprising:
   a gas supply;
   an evacuator;
   a vacuum chamber connected to said gas supply and said evacuator;
   a plasma treatment electrode disposed within said vacuum chamber for supporting thereon a substrate,
   plasma generator generating plasma by applying microwave energy, said plasma generator being disposed on said vacuum chamber in opposition to said substrate with a microwave injection window interposed between said plasma generator and said vacuum chamber, said plasma generator being provided in association with a first power supply;
   a second power supply provided in association with said plasma treatment electrode causing ions in said plasma to impact against said substrate, the second power supply being provided independently of said first power supply; and
   a magnetic field generator generating a magnetic field in such a manner that said plasma produced by said plasma generator within a space defined between said substrate and said microwave injection window is peripherally surrounded by a magnetic line of force so as to prevent said plasma from diffusing radially and outwardly.

15. A plasma treatment apparatus according to claim 14 wherein said second power supply comprises a high-frequency power source applying a high-frequency electric power to said plasma treatment electrode.

16. A plasma treatment apparatus according to claim 14 wherein said plasma generator comprises a microwave generating source as said first power supply means, a cavity resonator and a microwave guide.

17. A plasma treatment apparatus according to claim 16 wherein said cavity resonator is provided with matching means for allowing said cavity resonator to serve as the cavity resonator for said microwave.

18. A plasma treatment apparatus according to claim 16 wherein said cavity resonator is formed in a coaxial structure.

19. A plasma treatment apparatus according to claim 16 wherein said cavity resonator is so dimensioned that said microwave exhibits an axis-symmetrical mode.

20. A plasma treatment apparatus according to claim 14, wherein said microwave injecting window is formed of an electrically insulating material less susceptible to absorption of the microwave to serve as a partition wall to define said vacuum chamber and to transmit the microwave into said vacuum chamber.

* * * * *

UNITED STATES PATENT AND TRADEMARK OFFICE
CERTIFICATE OF CORRECTION

PATENT NO. : 5,021,114

DATED : June 4, 1991

INVENTOR(S) : Hiroshi Saito et al

It is certified that error appears in the above-identified patent and that said Letters Patent is hereby corrected as shown below:

Title Page:

Abstract, line 21, change "in" to --is--.

Signed and Sealed this

Second Day of March, 1993

Attest:

STEPHEN G. KUNIN

*Attesting Officer*  *Acting Commissioner of Patents and Trademarks*